(12) United States Patent
Hong

(10) Patent No.: US 10,878,865 B2
(45) Date of Patent: Dec. 29, 2020

(54) MEMORY DEVICE AND SIGNAL TRANSMITTING CIRCUIT THEREOF

(71) Applicant: SK hynix Inc., Gyeonggi-do (KR)

(72) Inventor: Yun-Gi Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 59 days.

(21) Appl. No.: 16/196,226

(22) Filed: Nov. 20, 2018

(65) Prior Publication Data

US 2019/0333552 A1 Oct. 31, 2019

(30) Foreign Application Priority Data

Apr. 30, 2018 (KR) ........................ 10-2018-0049942

(51) Int. Cl.
| | |
|---|---|
| *G11C 7/10* | (2006.01) |
| *G11C 7/22* | (2006.01) |
| *H03K 3/356* | (2006.01) |
| *H03K 19/0175* | (2006.01) |
| *H03K 19/20* | (2006.01) |

(52) U.S. Cl.
CPC ....... *G11C 7/222* (2013.01); *H03K 3/356104* (2013.01); *H03K 19/017509* (2013.01); *H03K 19/20* (2013.01)

(58) Field of Classification Search
CPC ...... G11C 7/222; G11C 7/1093; G11C 7/1066
USPC .................................................... 365/189.05
See application file for complete search history.

(56) References Cited

U.S. PATENT DOCUMENTS

| | | | | |
|---|---|---|---|---|
| 5,646,898 A | * | 7/1997 | Manning | ................ G11C 5/145 365/189.11 |
| 2003/0185088 A1 | * | 10/2003 | Kono | .................. G11C 7/1066 365/233.1 |
| 2019/0068191 A1 | * | 2/2019 | Liu | ................ H03K 19/018528 |

FOREIGN PATENT DOCUMENTS

| | | |
|---|---|---|
| KR | 100559348 | 3/2006 |
| KR | 1020080108856 | 12/2008 |

* cited by examiner

*Primary Examiner* — Hoai V Ho
*Assistant Examiner* — Minh Dinh
(74) *Attorney, Agent, or Firm* — IP & T Group LLP

(57) ABSTRACT

A signal transmitting circuit includes a signal driving unit suitable for driving an output signal in response to an input signal, during an operation mode, and a level shifting unit suitable for shifting a logic level of the output signal in a predetermined cycle, during a standby mode.

18 Claims, 7 Drawing Sheets

MEMORY DEVICE AND SIGNAL TRANSMITTING CIRCUIT THEREOF

CROSS-REFERENCE TO RELATED APPLICATION

This application claims priority under 35 U.S.C. § 119 to Korean Patent Application No. 10-2018-0049942, filed on Apr. 30, 2018, the disclosure of which is incorporated herein by reference in its entirety.

BACKGROUND

1. Field

Various embodiments of the present invention generally relate to a memory device. Particularly, the embodiments relate to a signal transmitting circuit of a memory device.

2. Discussion of the Related Art

In a memory device, signal lines for transmitting various signals may be long, extending across a variety of regions. Such signal lines may be coupled to various internal circuits of the memory device. As a result, the resistance or capacitive load of the signal lines may be increased. Therefore, in order to stably transmit a signal, the memory device may include a repeating circuit installed on the long-extended signal lines to repeat or relay a transmitted signal.

For example, internal circuits in a memory device such as a dynamic random access memory (DRAM) are operated in synchronization with a clock signal. In order to stably supply the clock signal to the internal circuits, the memory device may include a repeating circuit installed on a signal line for repeating and transmitting the clock signal.

In general, a repeating circuit installed in the memory device may be implemented with various types of transistors. However, since the threshold voltage levels of the transistors vary depending on stress, the pulse width of a transmitted signal may be changed by the repeating circuit. Therefore, the duty cycle of the transmitted signal may be distorted. Accordingly, the memory device requires a repeating circuit capable of stably transmitting a signal while preventing the distortion.

SUMMARY

Various embodiments are directed to a signal transmitting circuit capable of preventing distortion in duty cycle of a signal when transmitting the signal, and a memory device including the same.

In an embodiment of the present invention, a signal transmitting circuit includes: a signal driver suitable for generating an output signal in response to an input signal during an operation mode; and a level shifter suitable for shifting a logic level of the output signal in a set cycle during a standby mode.

In an embodiment of the present invention, a memory device includes: a command signal generator suitable for generating an internal command signal by decoding a command and address in response to a clock signal; an enable signal generator suitable for generating a clock enable signal, which is activated during an operation period of the memory device, in response to the internal command signal; a signal divider suitable for generating a toggling signal with a set cycle in response to the internal command signal; and a signal transmitting circuit suitable for transmitting the clock signal as an output signal during the operation period of the memory device in response to the clock enable signal and the toggling signal.

In an embodiment of the present invention, a signal transmitting circuit for a memory device, includes: a level shifter suitable for generating a driving signal that toggles with a set cycle; a signal driver suitable for receiving an input signal and the driving signal and generating an output signal; and a plurality of signal repeaters coupled in series, including a first stage signal repeater suitable for receiving and inverting the output signal to output a repeated signal and a last stage signal repeater suitable for receiving and inverting a signal from a previous stage signal repeater and generating a final signal to output to an internal circuit of the memory device; wherein, during an operation mode of the memory device, the signal driver generates the output signal in response to the input signal, and wherein, during a standby mode of the memory device, the signal driver generates the output signal in response to the driving signal.

DETAILED DESCRIPTION

Figure 1:
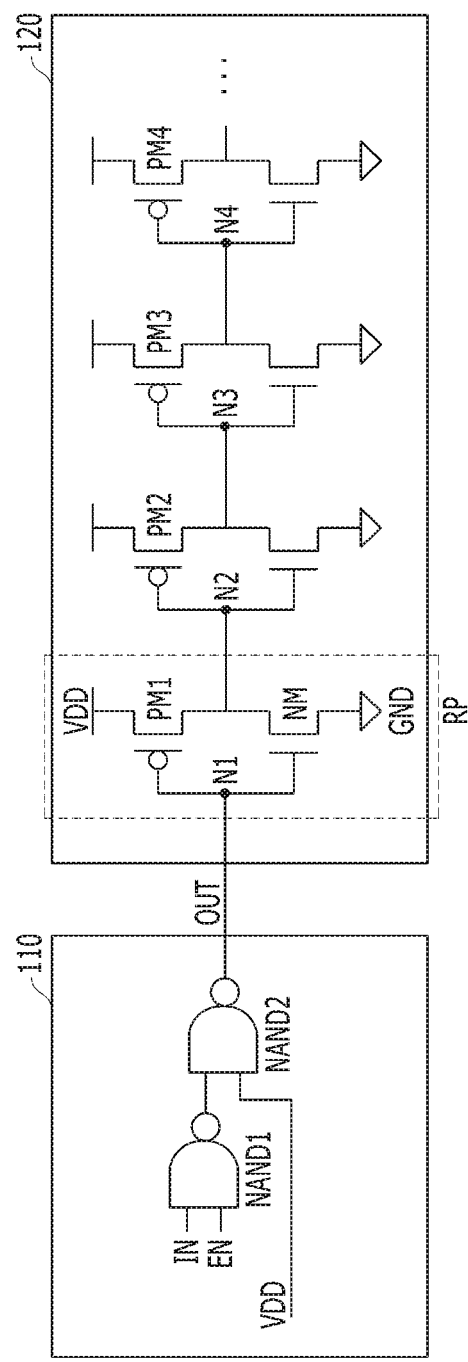
FIG. 1 illustrates a signal transmitting circuit in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

FIG. 1 illustrates a signal transmitting circuit 100 in accordance with an embodiment. The signal transmitting circuit 100 may be installed in a memory device, and transmit signals required for an operation of the memory device. Therefore, depending on a mode of the memory device, the signal transmitting circuit 100 may drive an input signal IN to an output signal OUT, and transmit the output signal OUT to internal circuits. For example, the signal transmitting circuit 100 may be installed in a dynamic random access memory (DRAM) and transmit a clock signal.

Referring to FIG. 1, the signal transmitting circuit 100 may include a signal driver 110 and a signal repeater 120. The signal driver 110 may drive the output signal OUT in response to the input signal IN, depending on the mode of the memory device. The signal driver 110 may include a first NAND gate NAND1 and a second NAND gate NAND2. The first NAND gate NAND1 may receive the input signal IN and an enable signal EN and output the NAND operation result of the received signals. The second NAND gate NAND2 may receive the output signal of the first NAND gate NAND1 and a signal corresponding to a supply voltage VDD and output the NAND operation result (output signal OUT).

The signal repeater 120 may receive the output signal OUT of the signal driver 110 and transmit the output signal OUT to the internal circuits of the memory device. The signal repeater 120 may include a plurality of repeaters RP. Each of the repeaters RP may include a PMOS transistor PM and an NMOS transistor NM which are coupled in series between a terminal for the supply voltage VDD and a terminal for a ground voltage GND.

When a voltage is continuously applied to the gates of the PMOS transistor PM and the NMOS transistor NM, stress may be applied to the PMOS transistor PM and the NMOS transistor NM. In particular, when a negative bias is continuously applied to the gate of the PMOS transistor, the PMOS transistor may be deteriorated by negative bias temperature instability (NBTI) stress. That is, the threshold voltage of the PMOS transistor may be increased.

As described above, the signal driver 110 may drive the output signal OUT in response to the input signal IN, depending on the mode of the memory device. That is, during an operation mode of the memory device, the enable signal EN may be activated. When the enable signal EN is activated, the signal driver 110 may output the output signal OUT at a logic level according to the logic level of the input signal IN.

During a standby mode of the memory device, however, the enable signal EN may be deactivated. In response to the deactivated enable signal EN, the signal driver 110 may retain the output signal OUT at a logic low ('0') level. Therefore, during the standby mode, input nodes N1 and N3 of odd-numbered repeaters RP among the plurality of repeaters RP may continuously retain a logic low level, but input nodes N2 and N4 of even-numbered repeaters RP may continuously retain a logic high ('1') level. As a result, NBTI stress may be applied to the PMOS transistors PM1 and PM3 of the odd-numbered repeaters RP, and the threshold voltages of the PMOS transistors PM1 and PM3 may be increased.

Figure 2:
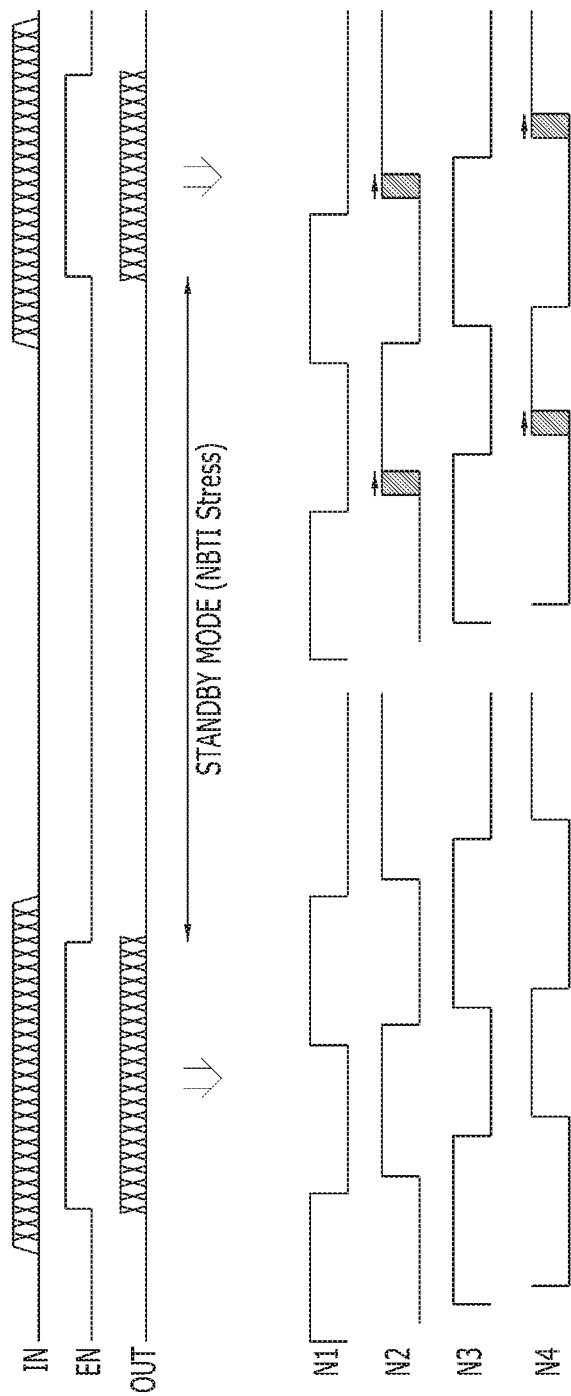
FIG. 2 is a signal waveform diagram of an exemplary signal transmitting circuit such as that illustrated in FIG. 1.

FIG. 2 is a waveform diagram of the signals transmitted by a signal transmitting circuit, for example, the signal transmitting circuit 100 illustrated in FIG. 1.

Referring to FIG. 2, during an active period of the enable signal EN, the signal driver 110 may drive the input signal IN to output the output signal OUT. In the other, i.e., non-active, periods, the signal driver 110 may retain the output signal OUT at a logic low level, even though the logic level of the input signal IN is changed.

For example, when the clock signal is inputted as the input signal IN, a clock enable signal which is activated/deactivated according to the mode of the DRAM may be inputted as the enable signal EN. During the operation mode of the DRAM, when the clock enable signal is activated, the signal driver 110 may drive the clock signal (input signal IN), and output the output signal OUT to the internal circuits of the DRAM. During the standby mode of the DRAM, when the clock enable signal is deactivated, the signal driver 110 may retain the output signal OUT at a logic low level in order to block the clock signal from being transmitted to the internal circuits of the DRAM.

The output signal OUT from the signal driver 110 may be transmitted by the signal repeater 120, as shown in FIG. 1. This process is illustrated in more detail through the signal waveforms of the input nodes N1 to N4 of the repeaters RP.

First, the signal waveforms of the input nodes N1 to N4 when the PMOS transistors PM1 to PM4 of the repeaters RP are not deteriorated but normally operated may be checked. In a first active period of the enable signal EN, the output signal OUT may be inverted at the input nodes N1 to N4 while being passed through the respective repeaters RP. Furthermore, whenever the output signal OUT is inverted by the repeaters RP, the output signal OUT may be delayed to some extent. However, since the PMOS transistors PM1 to PM4 of the repeaters RP are not deteriorated, rising/falling edges of the output signal OUT may be equally delayed. As a result, the signal repeater 120 may transmit the output signal OUT without distorting the duty cycle of the output signal OUT.

As described above, during the standby mode, the signal driver 110 may retain the output signal OUT at a logic low level. Therefore, NBTI stress may be applied to the first and third repeaters RP, and the threshold voltages of the first and third PMOS transistors PM1 and PM3 of the first and third repeaters RP may be increased.

Then, the output signal OUT may be outputted again, when the enable signal EN is activated or during a second active period of the enable signal EN. However, since the threshold voltages of the first and third PMOS transistors PM1 and PM3 have been increased, rising edges of signals outputted by the first and third repeaters RP may be shifted in comparison to the other signals. Since each of the shifted signals has an influence on the operation of the next repeater RP, the signal repeater 120 may transmit a signal in which the output signal OUT of the duty cycle has been distorted.

When the duty cycle of the clock signal or strobe signal of the memory device is distorted, the internal operating margins of the memory device may be reduced to cause a performance reduction in terms of an operation speed or voltage. Since NBTI stress is continuously applied over a long time, the threshold voltages of the odd-numbered PMOS transistors PM1 and PM3 may be increased further than those of the even-numbered PMOS transistors PM2 and PM4. Therefore, the duty cycle of the transmitted signal may be further distorted.

Figure 3:
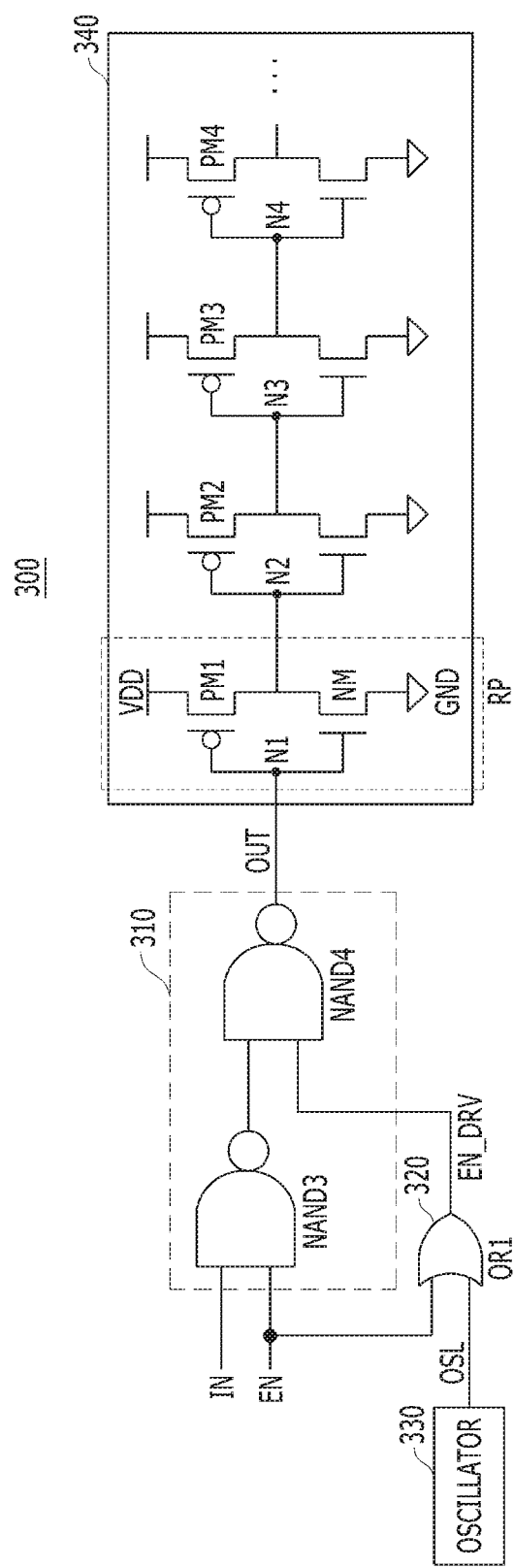
FIG. 3 illustrates a signal transmitting circuit in accordance with another embodiment of the present invention.

FIG. 3 illustrates a signal transmitting circuit 300 in accordance with another embodiment. Referring to FIG. 3, the signal transmitting circuit 300 may include a signal driver 310, a level shifter 320, an oscillator 330 and a signal repeater 340.

During an operation mode of the memory device, the signal driver 310 may drive an output signal OUT in response to an input signal IN. Specifically, during the operation mode of the memory device, when an enable signal EN is activated, the signal driver 310 may output the output signal OUT at a logic level according to the logic level of the input signal IN. The signal driver 310 may include a third NAND gate NAND3 and a fourth NAND gate NAND4. The third NAND gate NAND3 may receive the input signal IN and the enable signal EN. The fourth NAND gate NAND4 may receive an output signal of the third NAND gate NAND3 and a driving signal EN_DRV.

During a standby mode of the memory device, however, the level shifter 320 may shift the logic level of the output signal OUT in a set cycle. Specifically, during the standby mode of the memory device, when the enable signal EN is deactivated, the level shifter 320 may generate the driving signal EN_DRV in response to a toggling signal OSL with a set cycle. At this time, the signal driver 310 may output the output signal OUT at a logic level depending on the logic level of the driving signal EN_DRV.

The toggling signal OSL may swing between a logic high level and a logic low level in a set cycle. The level shifter 320 may include a first OR gate OR1 which receives the enable signal EN and the toggling signal OSL and outputs the driving signal EN_DRV. The driving signal EN_DRV generated by the level shifter 320 may be inputted to the fourth NAND gate NAND4 of the signal driver 310.

The oscillator 330 may generate the toggling signal OSL and output the toggling signal OSL to the level shifter 320. Although not illustrated in the drawing, the toggling signal OSL may also be generated by a counter or divider.

Since the signal repeater 340 has the same configuration as the signal repeater 120 illustrated in FIG. 1, description of the former is omitted here. The following description focuses on an operation of the signal repeater 340, which is different from that of FIG. 1.

Figure 4:
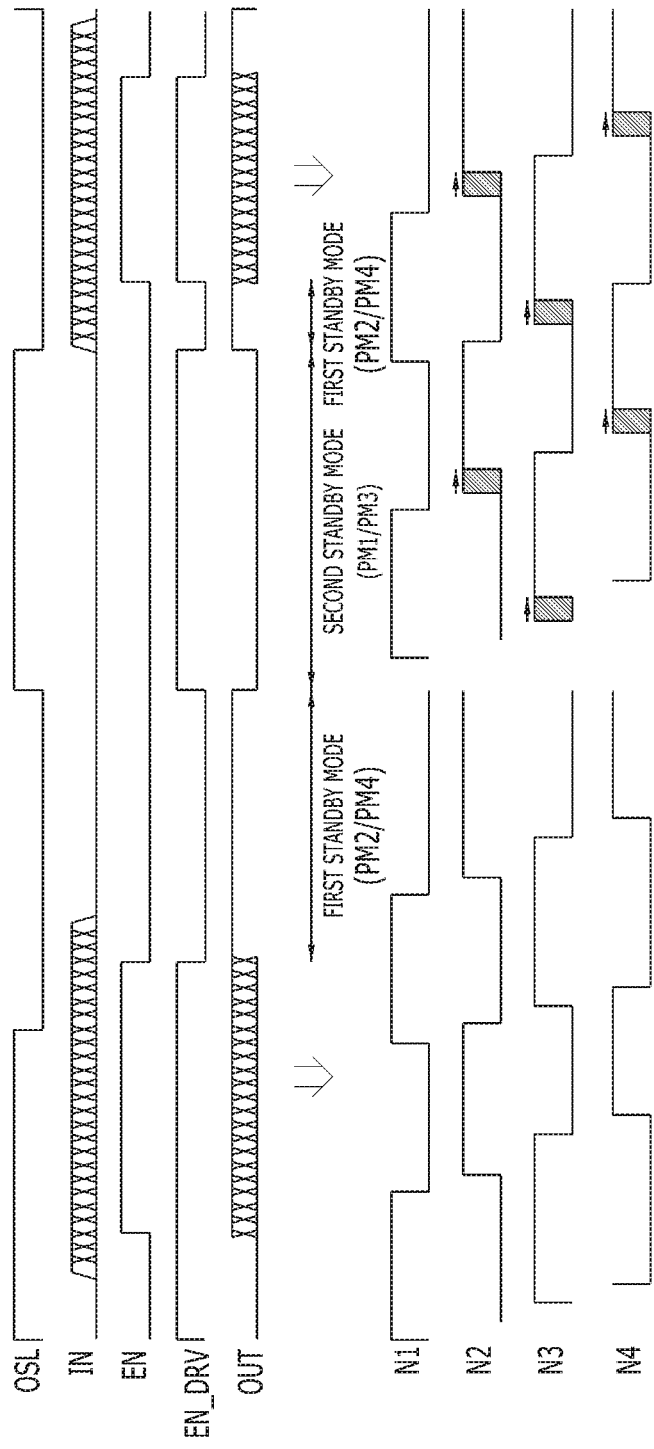
FIG. 4 is a signal waveform diagram of an exemplary signal transmitting circuit such as that illustrated in FIG. 3.

FIG. 4 is a waveform diagram of the signals transmitted by a signal transmitting circuit, for example, the signal transmitting circuit 300 illustrated in FIG. 3.

Referring to FIG. 4, during an active period of the enable signal EN, the signal driver 310 may drive the input signal IN to output the output signal OUT. The enable signal EN may be activated in a period where the input signal IN is inputted. Therefore, in an inactive period of the enable signal EN, the signal driver 310 may not drive the input signal IN to output the output signal OUT.

In the inactive period of the enable signal EN, the signal driver 310 may output the output signal OUT, depending on the logic level of the driving signal EN_DRV. The driving signal EN_DRV may toggle in a set cycle in the inactive period of the enable signal EN. In an embodiment, the signal driver 310 may generate the output signal OUT by inverting the driving signal EN_DRV.

That is, even in a period where the input signal IN is not inputted, the signal driver 310 may toggle the logic level of the output signal in the set cycle. Therefore, the logic levels of the input nodes N1 to N4 of the respective repeaters RP to transmit the output signal OUT may also be toggled in the set cycle.

The standby mode of the memory device may include first and second standby modes according to the toggled logic level of the output signal OUT. In the first standby mode, the signal driver 310 may output the output signal OUT at a logic high level. In the second standby mode, the signal driver 310 may output the output signal OUT at a logic low level.

Therefore, during the first standby mode, NBTI stress may be applied to the even-numbered repeaters RP, and the threshold voltages of the even-numbered PMOS transistors PM2 and PM4 may be increased. During the second standby mode, NBTI stress may be applied to the odd-numbered repeaters RP, and the threshold voltages of the odd-numbered PMOS transistors PM1 and PM3 may be increased. That is, the influence of the NBTI stress may be reduced while the NBTI stress is uniformly distributed by the plurality of repeaters RP.

When the enable signal EN is activated after the standby mode, the output signal OUT may be outputted again according to the input signal IN. Since the threshold voltages of the plurality of PMOS transistors PM1 to PM4 have been increased during the standby mode, the rising edges of the signals outputted by the respective repeaters RP may be shifted.

For example, when the signal of the first node N1 is inverted by the first repeater RP, a falling edge of the signal may be delayed further than a rising edge thereof. Then, the delayed signal may be outputted to the second node N2. When the inverted signal of the second node N2 is inverted again by the second repeater RP, a falling edge of the inverted signal may be delayed further than a rising edge thereof. Then, the delayed signal may be outputted to the third node N3. Therefore, since the rising edges of the signals inverted by the plurality of repeaters RP are shifted, the signal repeater 340 may transmit the output signal OUT without distorting the duty cycle of the output signal OUT.

Figure 5:
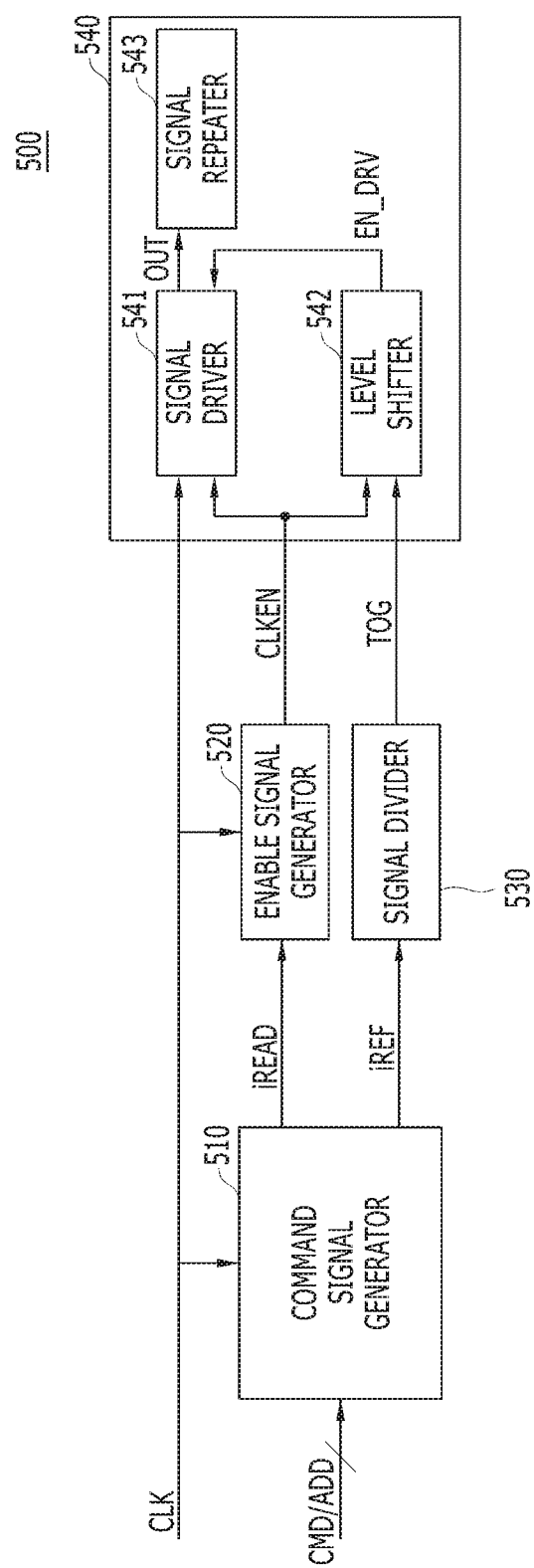
FIG. 5 is a block diagram illustrating a memory device in accordance with an embodiment of the present invention.

FIG. 5 is a block diagram illustrating a memory device 500 in accordance with an embodiment. The memory device 500 may include a volatile memory device such as a DRAM.

Therefore, the memory device 500 needs to periodically refresh memory cells in order to retain data stored in the memory cells. For this operation, a refresh command may be inputted to the memory device 500 periodically. The memory device 500 may generate a toggling signal TOG with a set cycle based on the refresh command inputted from an external device.

Referring to FIG. 5, the memory device 500 may include a command signal generator 510, an enable signal generator 520, a signal divider 530 and a signal transmitting circuit 540. Since the signal transmitting circuit 540 has the same configuration as the signal transmitting circuit 300 illustrated in FIG. 3, description of the former is omitted here.

The signal transmitting circuit 540 may include a signal driver 541, a signal level shifter 542 and a signal repeater 543. During the operation period of the memory device 500, the signal transmitting circuit 540 may transmit a clock signal CLK as the output signal OUT, in response to a clock enable signal CLKEN and the toggling signal TOG. That is, when the clock enable signal CLKEN is activated, the signal driver 541 may drive the clock signal CLK to output the output signal OUT. When the clock enable signal CLKEN is deactivated, the signal level shifter 542 may generate the driving signal EN_DRV in response to the toggling signal TOG, and the signal driver 541 may output the output signal OUT having a logic level depending on the logic level of the driving signal EN_DRV.

In response to the clock signal CLK, the command signal generator 510 may generate internal command signals by decoding a command/address CMD/ADD inputted from the external device. The command signal generator 510 may generate a read command signal iREAD for a read operation and a refresh command signal iREF for a refresh operation.

In response to the read command signal iREAD, the enable signal generator 520 may generate the clock enable signal CLKEN which is activated during a read operation period. The configuration of the enable signal generator 520 will be described in more detail with reference to FIG. 6A. Although FIG. 5 illustrates an operation of generating the clock enable signal CLKEN for the read operation, the present invention is not limited to that processing; the enable signal generator 520 may generate the clock enable signal CLKEN for a write operation in response to a write command signal.

The signal divider 530 may generate the toggling signal TOG with a set cycle by dividing the refresh command signal iREF. The refresh command signal iREF may be periodically generated for the refresh operation. The signal divider 530 may generate the toggling signal TOG by dividing the refresh command signal iREF by a multiple of two. The configuration of the signal divider 530 will be described in more detail with reference to FIG. 7.

Figure 6A:
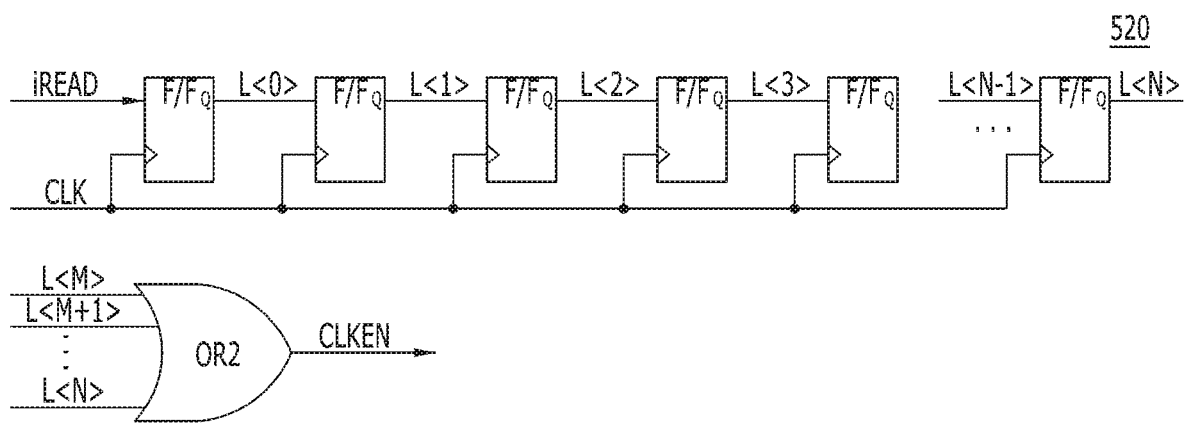
FIG. 6A is a circuit diagram illustrating an exemplary enable signal generator, which may be employed in the embodiment of FIG. 5.
Figure 6B:
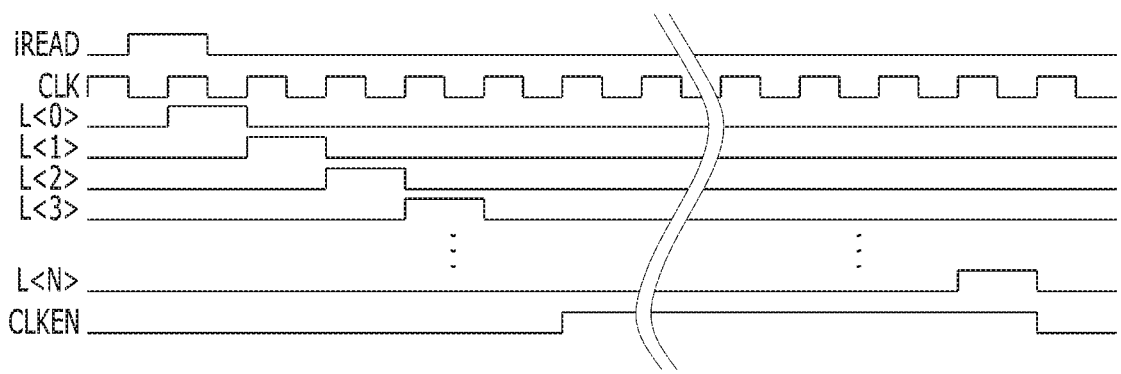
FIG. 6B is a signal waveform diagram of an exemplary enable signal generator such as that illustrated in FIG. 6A.

FIG. 6A is a circuit diagram illustrating an enable signal generator, for example, the enable signal generator 520 of FIG. 5. FIG. 6B is a signal waveform diagram of an enable signal generator, for example, the enable signal generator 520 illustrated in FIG. 6A.

Referring to FIG. 6A, the enable signal generator 520 may include a shift register and a second OR gate OR2. The shift register may include a plurality of flip-flops F/F. Each of the flip-flops F/F may shift an output signal of the previous stage to the next stage in response to the clock signal CLK. The second OR gate OR2 may receive some output signals L<M:N> of the output signals L<0:N> from the plurality of flip-flops F/F, and generate the clock enable signal CLKEN. The second OR gate OR2 may generate the clock enable signal CLKEN by performing an OR operation on the some output signals L<M:N>.

Referring to FIG. 6B, the plurality of flip-flops F/F may generate the plurality of output signals L<0:N> by shifting the read command signal iREAD once in synchronization with the clock signal CLK. The second OR gate OR2 may generate the clock enable signal CLKEN corresponding to active periods of the some output signals L<M:N> of the output signals L<0:N>. The clock enable signal CLKEN may indicate a period in which the clock is enabled during the read operation.

Figure 7A:
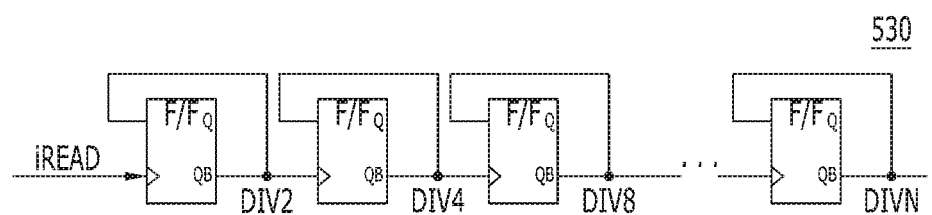
FIG. 7A is a circuit diagram illustrating an exemplary signal divider, which may be employed in the embodiment of FIG. 5.
Figure 7B:
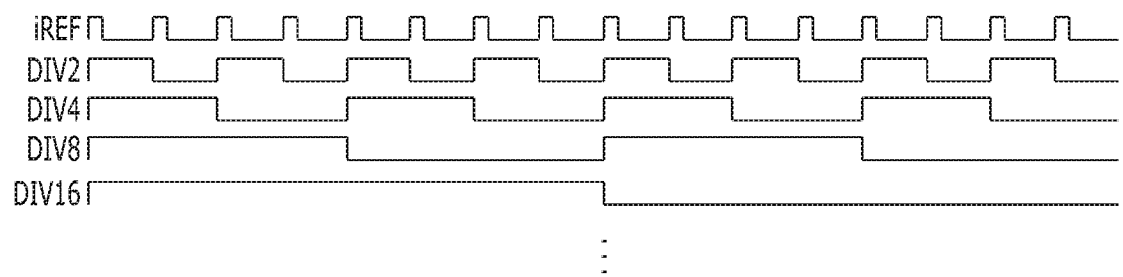
FIG. 7B is a signal waveform diagram of an exemplary signal divider such as that illustrated in FIG. 7A.

FIG. 7A is a circuit diagram illustrating a signal divider, for example, the signal divider 530 of FIG. 5. FIG. 7B is a signal waveform diagram of a signal divider, for example, the signal divider 530 illustrated in FIG. 7A.

Referring to FIG. 7A, the signal divider 530 may include a plurality of flip-flops F/F coupled in series. Each of the flip-flops F/F may output a signal to the next stage, the signal having a logic level which is varied according to an output signal of the previous stage. As a result, each of the flip-flops F/F may divide the output signal of the previous stage by two, and output the divided signal to the next stage.

Referring to FIG. 7B, the pulse-type refresh command signal iREF may be received from the command signal generator 510. The pulse-type refresh command signal iREF may be generated in response to the command/address CMD/ADD indicating the refresh operation. The command/address CMD/ADD indicating the refresh operation may be periodically received at command signal generator 510. The refresh command signal iREF may include a periodically activated pulse signal. The signal divider 530 may generate signals DV2, DV4, DV8, DV16 . . . and DVN by dividing the refresh command signal iREF, the signals DV2, DV4, DV8, DV16, . . . and DVN toggling in a set cycle.

Specifically, the first flip-flop F/F of the signal divider 530 may generate the first toggling signal DV2 by dividing the refresh command signal iREF by two. The second flip-flop F/F of the signal divider 530 may generate the second toggling signal DV4 by dividing the first toggling signal DV2 by two. As a result, the second toggling signal DV4 may correspond to a signal obtained by dividing the refresh command signal iREF by four.

Through the above-described operation, the signal divider 530 may generate the toggling signals DV2, DV4, DV8, DV16, . . . and DVN by dividing the refresh command signal iREF by two, four, eight, . . . and N using the plurality of flip-flops F/F. The signal divider 530 may output the toggling signal TOG having a desired cycle, among the plurality of toggling signals DV2, DV4, DV8, DV16, . . . and DVN, to the signal transmitting circuit 540.

In accordance with embodiments of the present invention, the memory device is configured to reduce stress which may occur on a signal transmission line during the standby mode thereof. For this operation, the memory device in the standby mode may periodically shift the voltage level of the signal transmission line using the signal which toggles in the set cycle. Therefore, stress may be uniformly distributed to the signal transmitting circuits installed on the signal transmission line, and the duty cycle of the signal transmitted by the signal transmitting circuits may be constantly retained.

Furthermore, the memory device may periodically shift the voltage level of the signal transmission line using a signal periodically inputted from an external device, for example, a command for the refresh operation. Therefore, the memory device may reduce stress which may occur on the signal transmission line, without a burden caused by an additional component.

Although various embodiments have been described and illustrated, it will be apparent to those skilled in the art in light of the present disclosure that various changes and modifications may be made without departing from the spirit and scope of the invention as defined in the following claims.

What is claimed is:
1. A signal transmitting circuit comprising:
a signal driver suitable for generating an output signal in response to an input signal during an operation mode; and
a level shifter suitable for shifting a logic level of the output signal in a set cycle during a standby mode, wherein, during the standby mode, when an enable signal is deactivated, the level shifter generates a driving signal in response to a toggling signal with the set cycle.

2. The signal transmitting circuit of claim 1, wherein, during the operation mode, when the enable signal is activated, the signal driver drives the output signal at a logic level according to the logic level of the input signal.

3. The signal transmitting circuit of claim 1, wherein, during the standby mode, when the enable signal is deactivated, the signal driver drives the output signal at a logic level according to the logic level of the driving signal.

4. The signal transmitting circuit of claim 1, further comprising:
an oscillator suitable for generating the toggling signal and outputting the toggling signal to the level shifter.

5. The signal transmitting circuit of claim 1, wherein the toggling signal is generated by dividing a command for a refresh operation of a memory device.

6. The signal transmitting circuit of claim 5, wherein the input signal comprises a clock signal of the memory device, and the enable signal comprises a clock enable signal which is activated during a read or write operation period of the memory device.

7. The signal transmitting circuit of claim 1, further comprising:
a plurality of repeaters suitable for transmitting the output signal to internal circuits of a memory device.

8. A memory device comprising:
a command signal generator suitable for generating an internal command signal by decoding a command and address in response to a clock signal;
an enable signal generator suitable for generating a clock enable signal, which is activated during an operation period of the memory device, in response to the internal command signal;
a signal divider suitable for generating a toggling signal with a set cycle in response to the internal command signal; and
a signal transmitting circuit suitable for transmitting the clock signal as an output signal during the operation period of the memory device in response to the clock enable signal and the toggling signal.

9. The memory device of claim 8, wherein the command signal generator generates read, write and refresh command signals for read, write and refresh operations, respectively, of the memory device.

10. The memory device of claim 9, wherein the enable signal generator activates the clock enable signal during read and write operation periods of the memory device in response to the read and write command signals, respectively.

11. The memory device of claim 9, wherein the enable signal generator comprises:
a shift register suitable for generating a plurality of output signals by shifting the read and write command signals in synchronization with the clock signal; and
an OR gate suitable for receiving a part of the plurality of output signals and generating the clock enable signal.

12. The memory device of claim 9, wherein the signal divider generates the toggling signal by dividing the refresh command signal by a multiple.

13. The memory device of claim 12, wherein the signal divider comprises a plurality of flip-flops coupled in series, and each of the flip-flops divides an output signal from a flip-flop of the previous stage by two, and outputs the divided signal to a flip-flop of the next stage.

14. The memory device of claim 8, wherein the signal transmitting circuit comprises:
a signal driver suitable for driving the clock signal to generate the output signal when the clock enable signal is activated; and
a level shifter suitable for generating a driving signal in response to the toggling signal when the clock enable signal is deactivated.

15. The memory device of claim 14, wherein when the clock enable signal is deactivated, the signal driver drives the output signal at a logic level according to the logic level of the driving signal.

16. The memory device of claim 14, wherein the signal transmitting circuit further comprises:
a plurality of repeaters suitable for transmitting the output signal to internal circuits of the memory device.

17. The memory device of claim 8, wherein the signal transmitting circuit comprises:
a first NAND gate suitable for receiving the clock signal and the clock enable signal;
an OR gate suitable for receiving the clock enable signal and the toggling signal, and outputting a driving signal; and
a second NAND gate suitable for receiving an output signal of the first NAND gate and the driving signal, and outputting the output signal.

18. A signal transmitting circuit for a memory device, the circuit comprising:
a level shifter suitable for generating a driving signal that toggles with a set cycle;
a signal driver suitable for receiving an input signal and the driving signal and generating an output signal; and
a plurality of signal repeaters coupled in series, including a first stage signal repeater suitable for receiving and inverting the output signal to output a repeated signal and a last stage signal repeater suitable for receiving and inverting a signal from a previous stage signal repeater and generating a final signal to output to an internal circuit of the memory device;
wherein, during an operation mode of the memory device, the signal driver generates the output signal in response to the input signal, and
wherein, during a standby mode of the memory device, the signal driver generates the output signal in response to the driving signal.

* * * * *